United States Patent
Kim et al.

(10) Patent No.: US 11,574,227 B2
(45) Date of Patent: Feb. 7, 2023

(54) NOISE CLASSIFICATION THROUGH THE OUTPUT OF RANDOM QUANTUM CIRCUITS

(71) Applicant: INTERNATIONAL BUSINESS MACHINES CORPORATION, Armonk, NY (US)

(72) Inventors: Jinsung Kim, White Plains, NY (US); Lev S. Bishop, Dobbs Ferry, NY (US); John A. Smolin, Yorktown, NY (US); Antonio Corcoles-Gonzalez, Mount Kisco, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 797 days.

(21) Appl. No.: 16/539,433

(22) Filed: Aug. 13, 2019

(65) Prior Publication Data

US 2021/0049492 A1    Feb. 18, 2021

(51) Int. Cl.
*G06N 10/00* (2022.01)
*G06F 30/20* (2020.01)
*G06F 17/18* (2006.01)

(52) U.S. Cl.
CPC ............ *G06N 10/00* (2019.01); *G06F 17/18* (2013.01); *G06F 30/20* (2020.01)

(58) Field of Classification Search
None
See application file for complete search history.

(56) References Cited

U.S. PATENT DOCUMENTS

| 6,081,119 A | 6/2000 | Carson et al. |
| 2017/0206461 A1 | 7/2017 | Friesen et al. |

(Continued)

FOREIGN PATENT DOCUMENTS

WO    2018026522 A4    2/2018

OTHER PUBLICATIONS

Wootton, J., "Benchmarking of quantum processors with random circuits", arXiv, Jun. 7, 2018 https://arxiv.org/abs/1806.02736.*

(Continued)

*Primary Examiner* — Catherine T. Rastovski
(74) *Attorney, Agent, or Firm* — Amin, Turocy & Watson, LLP

(57) ABSTRACT

A method for characterizing noise in a quantum system, the quantum system including a plurality of qubits and a plurality of entangling gates native to the quantum system, includes generating a random quantum circuit on a quantum processor, the random quantum circuit comprising the plurality of entangling gates native to the quantum system. The method includes running a simulation of the random quantum circuit on a classical computer a plurality of times to obtain ideal outcomes, and running the random quantum circuit on the quantum processor a plurality of times to obtain experimental outcomes. The method includes grouping the experimental outcomes based on probabilities of the ideal outcomes to obtain a first distribution, and grouping the experimental outcomes based on probabilities of the experimental outcomes to obtain a second distribution. The method includes characterizing noise in the quantum system based on the first distribution and the second distribution.

25 Claims, 12 Drawing Sheets

(56) References Cited

U.S. PATENT DOCUMENTS

| | | | |
|---|---|---|---|
| 2019/0018721 A1 | 1/2019 | Wallman et al. | |
| 2019/0026211 A1 | 1/2019 | Wallman et al. | |
| 2019/0042677 A1* | 2/2019 | Matsuura | G06N 10/20 |
| 2019/0156239 A1 | 5/2019 | Martinis et al. | |

OTHER PUBLICATIONS

Bouland et al., "Quantum Supremacy and the Complexity of Random Circuit Sampling", arXiv, Mar. 12, 2018 https://arxiv.org/abs/1803.04402.*

Wallman et al., "Estimating the coherence of noise", New J. Phys. 17 (2015).*

Bouland et al., "On the complexity and verification of quantum random circuit samples" Nature Physics, vol. 15 Oct. 29, 2018.*

Ferracin et al. "Verifying quantum computations on noisy intermediate-scale quantum devices," arXiv:1811.09709v1 [quant-ph] Nov. 23, 2018.

Sarah Sheldon et al. "Characterizing errors on qubit operations via iterative randomized benchmarking," arXiv:1504.06597 [quant-ph] Apr. 24, 2015.

David C. McKay et al. "Three Qubit Randomized Benchmarking," arXiv:1712.06550v2 [quant-ph] Dec. 12, 2018.

C.H. Yang et al. "Silicon qubit fidelities approaching incoherent noise limits via pulse optimisation," arXiv:1807.09500v2 [cond-mat.mes-hall] Sep. 30, 2018.

Joel J. Wallman et al. "Estimating the Coherence of Noise," arXiv:1503.07865v4 [quant-ph] Jan. 26, 2019.

Andrew W. Cross et al. "Validating quantum computers using randomized model circuits," arXiv:1811.12926v2 [quant-ph] Oct. 11, 2019.

Sergio Boixo et al. "Characterizing Quantum Supremacy in Near-Term Devices," arXiv:1608.00263v3 [quant-ph] Apr. 5, 2017.

Adam Bouland et al. "Quantum Supremacy and the Complexity of Random Circuit Sampling," arXiv:1803.04402v1 [quant-ph] Mar. 12, 2018.

Bouland et al., "On the complexity and verification of quantum random circuit sampling", Nature Physics, vol. 15, Oct. 29, 2018, pp. 159-163.

Blume-Kohout et al. "A volumetric framework for quantum computer benchmarks", Cornell University Library, May 6, 2019, XP081270672.

Wootton, "Benchmarking of quantum processors with random circuits", Cornell University Library, Jun. 7, 2018, XP080888216.

Proctor et al., "Direct randomized benchmarking for multi-qubit devices", Cornell University Library, Jul. 30, 2019, XP081451231.

J.S. Kim et al, "U16.4: Detection of coherent noise through the output of random quantum circuits", APS March Meeting 2020, Sesion: Characterizing Quantum Computing Systems and Compenents III, Mar. 5, 2020, XP055716989.

PCT/EP2020/062608 International Search Report dated Mar. 8, 2020.

PCT/EP2020/062608 Written Opinion dated Mar. 8, 2020.

* cited by examiner

NOISE CLASSIFICATION THROUGH THE OUTPUT OF RANDOM QUANTUM CIRCUITS

STATEMENT OF GOVERNMENT SUPPORT

This invention was made with government support under W911NF-14-1-0124 awarded by the Army Research Office (ARO). The government has certain rights in the invention.

BACKGROUND

The currently claimed embodiments of the present invention relate to systems and methods for noise classification, and more specifically, to the use of random quantum circuits for noise classification.

Physical systems for quantum information processing undergo typically noise processes that may affect their output in an undesired manner. These noise processes have a variety of origins but can be roughly classified into two families: incoherent and coherent noise. Incoherent noise tends to arise from stochastic and Markovian processes—processes for which the probability of reaching any future state depends only on the present state. Incoherent noise is irreversible and memoryless. Coherent noise, on the other hand, can be corrected and typically arises from imperfect realization of the unitary operations required for quantum information processing. Coherent noise is repeatable and can be thought of as over- or under-rotations, originating from miscalibrations or cross-talk.

Distinguishing between these two types of noise can be critical for some quantum computing tasks. In the past some methods have been developed that can classify noise but they invariably lack scalability beyond just a few qubits. Scalable methods for characterizing quantum systems do not discriminate amongst noise types, and therefore cannot be used to identify and mitigate coherent noise sources.

SUMMARY

According to an embodiment of the present invention, a method for characterizing noise in a quantum system, the quantum system including a plurality of qubits and a plurality of entangling gates native to the quantum system, includes generating a random quantum circuit on a quantum processor, the random quantum circuit including the plurality of entangling gates native to the quantum system. The method includes running a simulation of the random quantum circuit on a classical computer a plurality of times to obtain a corresponding plurality of ideal outcomes, and running the random quantum circuit on the quantum processor a plurality of times to obtain a corresponding plurality of experimental outcomes. The method includes grouping the plurality of experimental outcomes based on probabilities of the ideal outcomes to obtain a first distribution, and grouping the plurality of experimental outcomes based on probabilities of the experimental outcomes to obtain a second distribution. The method includes characterizing noise in the quantum system based on the first distribution and the second distribution.

According to an embodiment of the present invention, a system for characterizing noise in a quantum system includes a quantum processor including a plurality of qubits, a random quantum circuit including a plurality of entangling gates native to the quantum system, and a classical processor. The classical processor is configured to run a simulation of the random quantum circuit a plurality of times to obtain a corresponding plurality of ideal outcomes, and receive from the quantum circuit a plurality of experimental outcomes corresponding to the quantum circuit acting on the plurality of qubits a plurality of times. The classical processor is configured to group the plurality of experimental outcomes based on probabilities of the ideal outcomes to obtain a first distribution, and group the plurality of experimental outcomes based on probabilities of the experimental outcomes to obtain a second distribution. The classical processor is configured to characterize noise in the quantum system based on the first distribution and the second distribution.

According to an embodiment of the present invention, a computer-readable medium includes computer-executable code which when read by a computer causes the computer to run a simulation of a random quantum circuit a plurality of times to obtain a corresponding plurality of ideal outcomes, and receive from the quantum circuit a plurality of experimental outcomes corresponding to the quantum circuit acting on the plurality of qubits a plurality of times. The computer-executable code when read by a computer further causes the computer to group the plurality of experimental outcomes based on probabilities of the ideal outcomes to obtain a first distribution, group the plurality of experimental outcomes based on probabilities of the experimental outcomes to obtain a second distribution, and characterize noise in the quantum system based on the first distribution and the second distribution.

DETAILED DESCRIPTION

Figure 1:
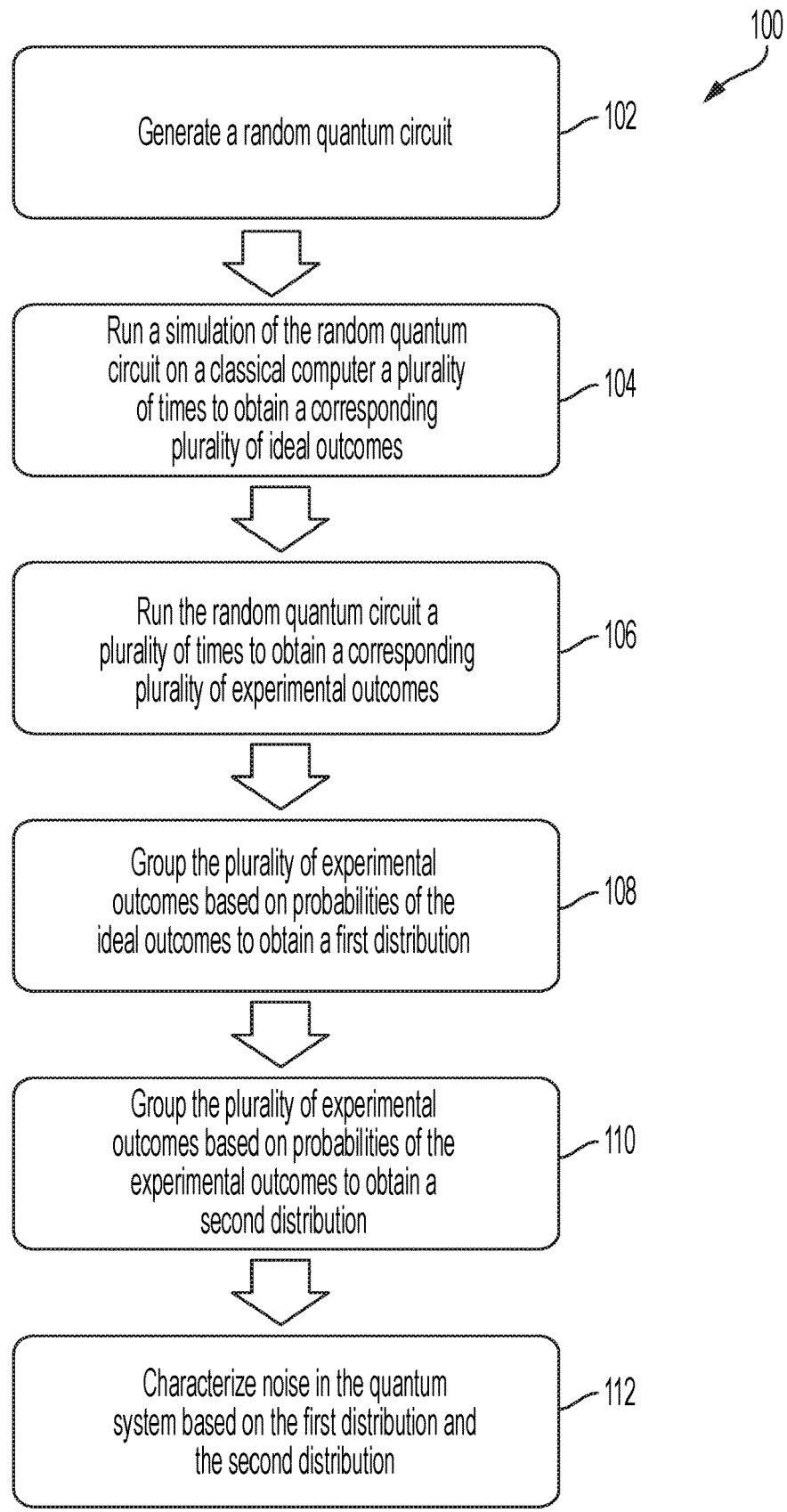
FIG. 1 is a flowchart that illustrates a method for characterizing noise in a quantum system according to an embodiment of the present invention.

FIG. 1 is a flowchart that illustrates a method 100 for characterizing noise in a quantum system according to an embodiment of the present invention. The quantum system includes a plurality of qubits and a plurality of entangling gates native to the quantum system. The method 100 includes generating a random quantum circuit 102. The random quantum circuit includes the plurality of entangling gates native to the quantum system. The method includes running a simulation of the random quantum circuit on a classical computer a plurality of times to obtain a corresponding plurality of ideal outcomes 104. The method includes running the random quantum circuit a plurality of times to obtain a corresponding plurality of experimental outcomes 106. The method includes grouping the plurality of experimental outcomes based on probabilities of the ideal outcomes to obtain a first distribution 108. The method includes grouping the plurality of experimental outcomes based on probabilities of the experimental outcomes to obtain a second distribution 110. The method includes characterizing noise in the quantum system based on the first distribution and the second distribution 112.

According to an embodiment of the present invention, characterizing noise in the quantum system includes quantifying coherent and incoherent noise in the quantum system.

According to an embodiment of the present invention, the random quantum circuit includes a plurality of random single-qubit rotations in addition to the entangling gates native to the quantum system. The plurality of entangling gates native to the quantum system, may be, for example, two-qubit CNOT gates. However, the embodiments of the invention are not limited to two-qubit CNOT gates. Other entangling gates may also be employed.

Depending on the type of hardware employed, different quantum gates are easier to implement and more natural to use. Native gates refers to the quantum gates that are the natural choice of gates to employ for a given hardware. For example, in some hardware, the CNOT gate is the natural entangling gate to use. In other hardware, the CPHASE or CZ gate may be the natural entangling gate to use. Non-native gates require multiple native gates to implement. Native entangling gates are implemented on qubits that are directly coupled to each other by the hardware and do not require additional qubit SWAPs to implement. In some hardware, specific qubits are directly coupled to other qubits by a physical resonator bus that is built into the hardware. Other hardware may have other connectivity schemes where every qubit is coupled to every other qubit. Embodiments of the invention use entangling gates that are native to the quantum system to generate a random quantum circuit.

Figure 2:
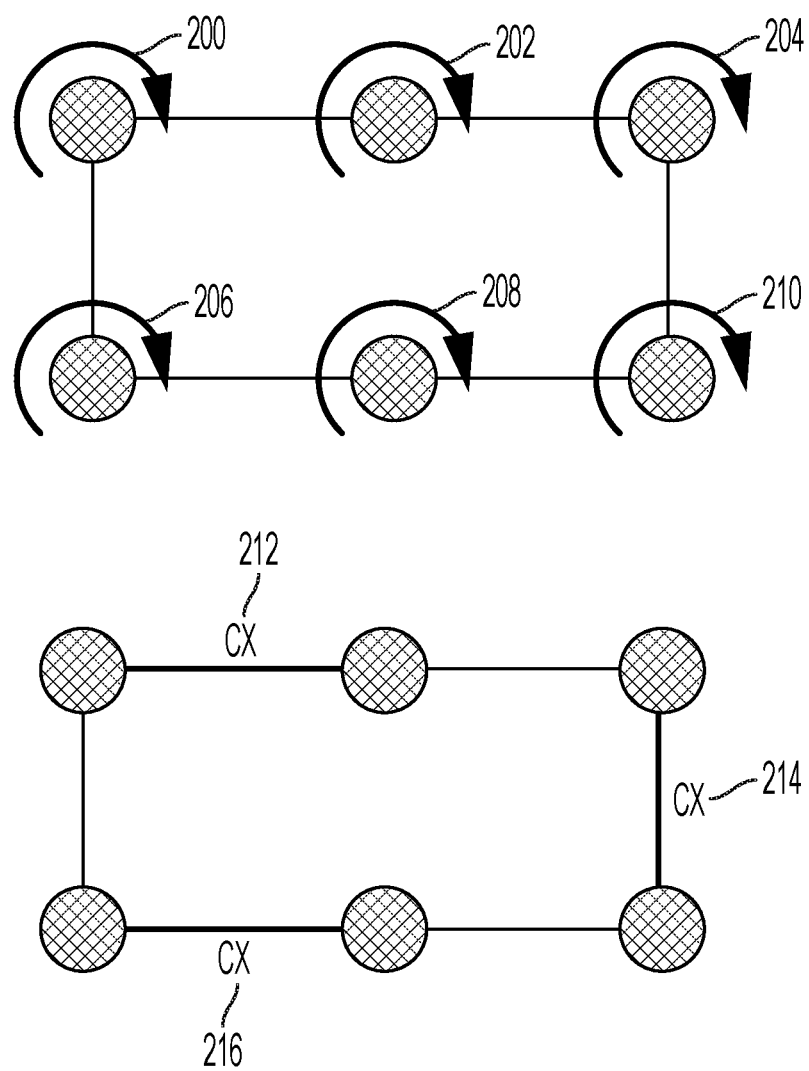
FIG. 2 is a schematic illustration of an example of a random quantum circuit that acts on six qubits (circles in FIG. 2).
Figure 3:
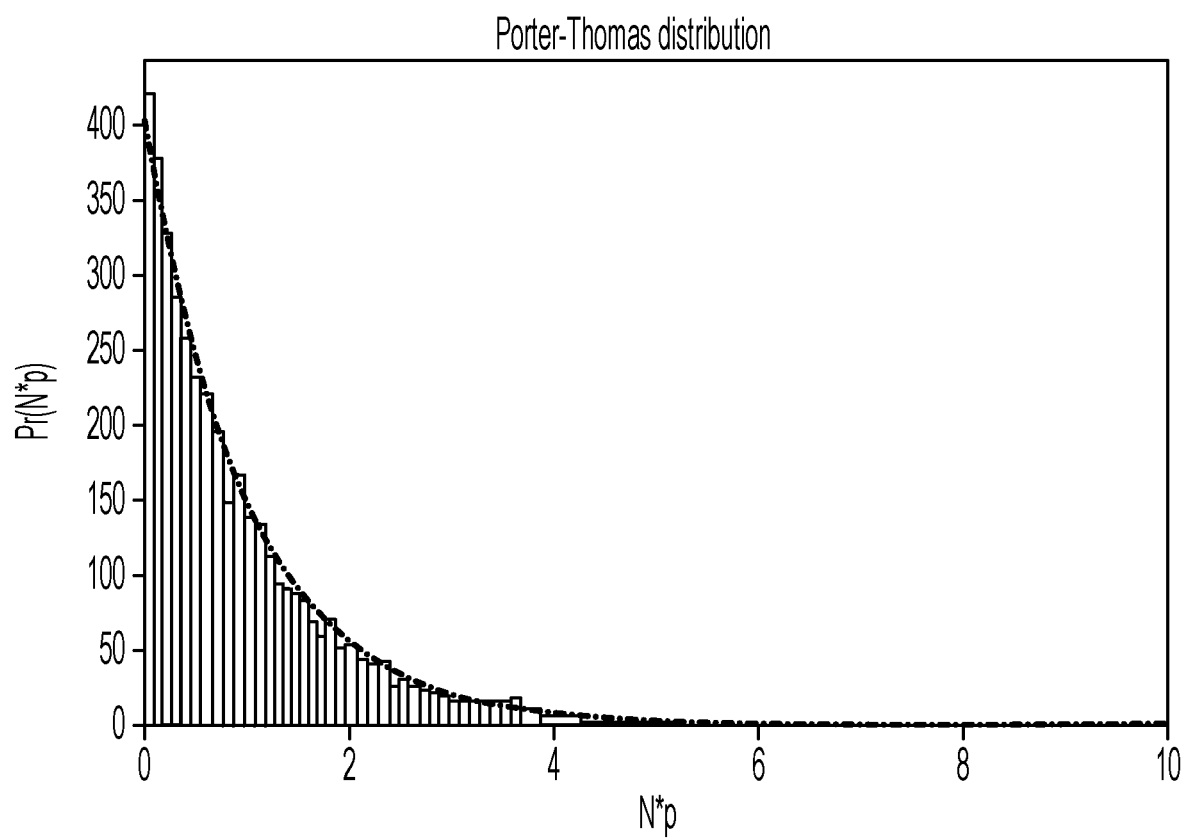
FIG. 3 is an example plot illustrating a Porter-Thomas distribution.

According to an embodiment of the present invention, the random quantum circuit includes alternating cycles of single-qubit rotations and two-qubit CNOT gates. FIG. 2 is a schematic illustration of an example of a random quantum circuit that acts on six qubits (circles in FIG. 2). The random quantum circuit includes random unitary single-qubit rotations 200, 202, 204, 206, 208, 2010 and CNOT gates 212, 214, 2016 that act on random pairs of connected qubits. The random unitary single-qubit rotations 200-210 and CNOT gates 212, 214, 2016 alternately act on the qubits for x cycles. For sufficient depth x, the output distribution tends toward a Porter-Thomas (PT) distribution. FIG. 3 is a plot showing a Porter-Thomas distribution. N*p is plotted along the x-axis, where $N=2^n$, where n is the number of qubits in the quantum system, and p is the probability of obtaining a particular outcome. The probability p is multiplied by N so that the x-axis labels are of order 1, instead of 1/N, which may be a very small number. The probability of N*p, Pr(N*p), is plotted along the y-axis. For a random quantum circuit including random entangling unitary operators and having sufficient depth, the output distribution tends toward a Porter-Thomas distribution, such as that shown in FIG. 3.

According to an embodiment of the invention, grouping the plurality of experimental outcomes includes defining a plurality of bins such that when the plurality of ideal outcomes are binned by ideal probability, a sum of probabilities in each bin is equal for a Porter-Thomas distribution. As described above, the method includes running a simulation of the random quantum circuit on a classical computer a plurality of times to obtain a corresponding plurality of ideal outcomes. From the plurality of ideal outcomes, an ideal probability is determined for each of the $N=2^n$ possible outcomes. The ideal probabilities are used to generate bins. The bins are generated such that when the ideal outcomes are binned according to the ideal probability, the sum of the probabilities in each bin is equal for a Porter-Thomas distribution.

Figure 4:
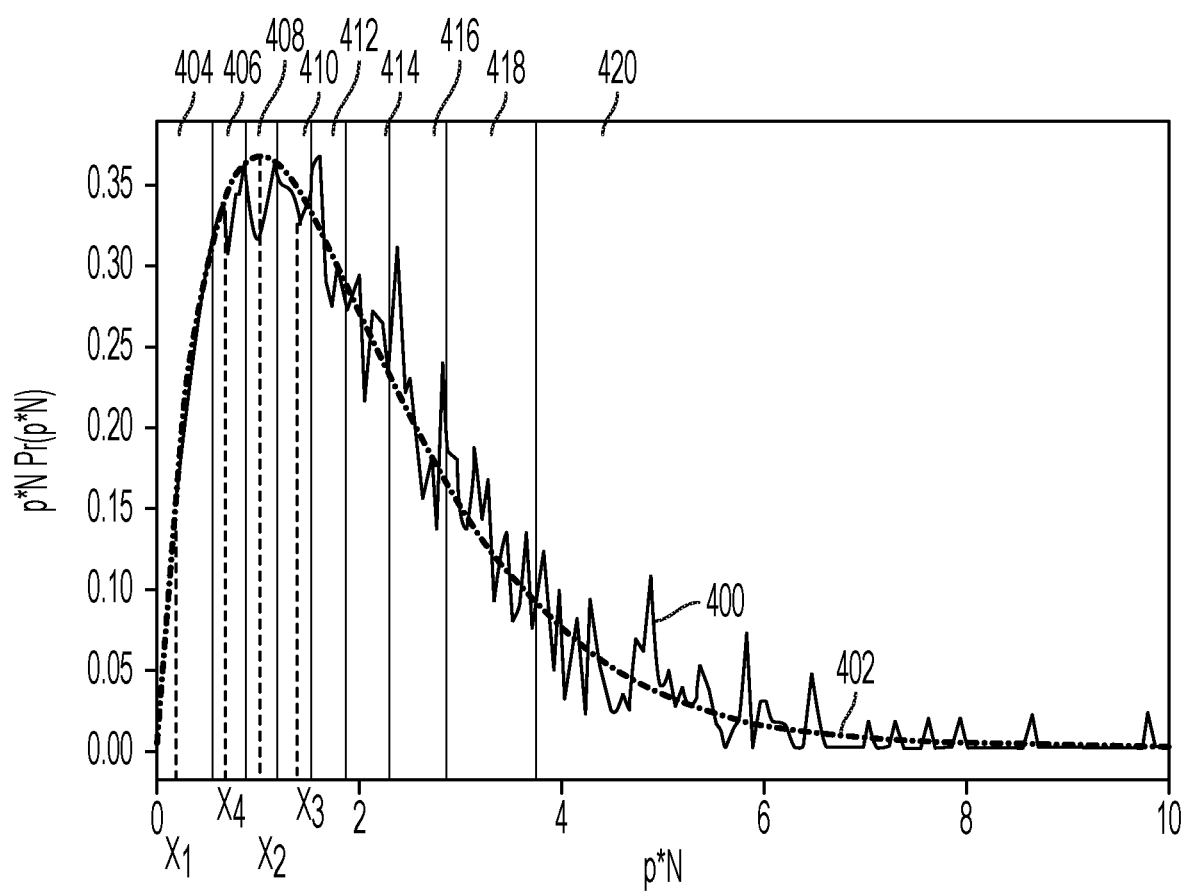
FIG. 4 is an example plot illustrating the sorting of bitstrings into bins.

FIG. 4 is an example plot demonstrating the sorting of bitstrings into bins. The jagged curve is an example of ideal outcomes plotted according to their ideal probabilities to provide an ideal distribution 400. For example, the simulation may be run on a classical computer 1000 times, with each run having a corresponding bitstring as an ideal output. The ideal outputs are used to determine an ideal probability corresponding to each possible bitstring, and the probability of the ideal probabilities is the ideal distribution 400. The smooth curve 402 is a Porter-Thomas distribution. It is clear from FIG. 4 that the ideal distribution 400 follows the Porter-Thomas distribution.

The ideal distribution 400 is used to generate bins such that the sum of the probabilities in each bin is equal for a Porter-Thomas distribution. In FIG. 4, nine bins are generated: bin 1 404, bin 2 406, bin 3 408, bin 4 410, bin 5 412, bin 6 414, bin 7 416, bin 8 418, and bin 9 420. Bin edges are indicated by the solid vertical lines. As described above, the ideal outputs are used to determine an ideal probability corresponding to each possible bitstring. Examples of such ideal probabilities for four possible bitstrings are shown in Table 1. The ideal probabilities determine the bin to which the bitstring is assigned, for example, bitstring $x_1$ is assigned to bin 1 based on the ideal probability, and bitstring 2 is assigned to bin 2 based on the idea probability.

TABLE 1

| Binning Bitstrings by Ideal Probability | | |
| --- | --- | --- |
| Bitstring $x_j$ | Ideal Probability *N | Bin # |
| $x_1$: |000000⟩ | 0.1265 | 1 |
| $x_2$: |000001⟩ | 0.9506 | 3 |
| $x_3$: |000010⟩ | 1.4793 | 4 |
| $x_4$: |000011⟩ | 0.6611 | 2 |

Once the bins have been generated, the plurality of experimental outcomes resulting from running the random quantum circuit a plurality of times are assigned to bins. The plurality of experimental outcomes are binned based on probabilities of the ideal outcomes, and based on the probabilities of the experimental outcomes. Although the present example describes binning according to ideal outcomes first, and binning according to experimental outcomes second, embodiments of the present invention are not limited to a particular order.

According to an embodiment of the present invention, the plurality of experimental outcomes are binned based on probabilities of the ideal outcomes to obtain a first distribution. For example, each experimental outcome |000000⟩ is binned in bin 1, according the ideal probability. Each experimental outcome |000001⟩ is binned in bin 2, according to the ideal probability. The resulting distribution, referred to herein as the "first distribution," may deviate from the ideal distribution if p*N Pr(p*N) is different from the ideal value for a particular bitstring. The deviation may be a result of coherent noise, incoherent noise, or a combination of both.

According to an embodiment of the present invention, the plurality of experimental outcomes are binned based on probabilities of the experimental outcomes to obtain a second distribution. Table 2 shows an example of experimental probabilities for four bitstrings. For 1000 runs of a random quantum circuit acting on 6 qubits, 8 shots resulting in the experimental output $x_1$: |000000⟩. The experimental probability*N is thus $$\frac{8}{1000} * 2^6 = 0.512.$$

Using the same bins as above, this places $x_1$: |000000⟩ in bin 1. The experimental probability*N for $x_2$: |000001⟩ is 1.216, placing $x_2$ in bin 4.

TABLE 2

Binning Bitstrings by Experimental Probability

| Bitstring $x_j$ | Experimental Probability *N | Bin # |
|---|---|---|
| $x_1$: |000000⟩ | 8 shots = 0.512 | 1 |
| $x_2$: |000001⟩ | 19 shots = 1.216 | 4 |
| $x_3$: |000010⟩ | 20 shots = 1.280 | 4 |
| $x_4$: |000011⟩ | 9 shots = 0.576 | 2 |

Figure 5:
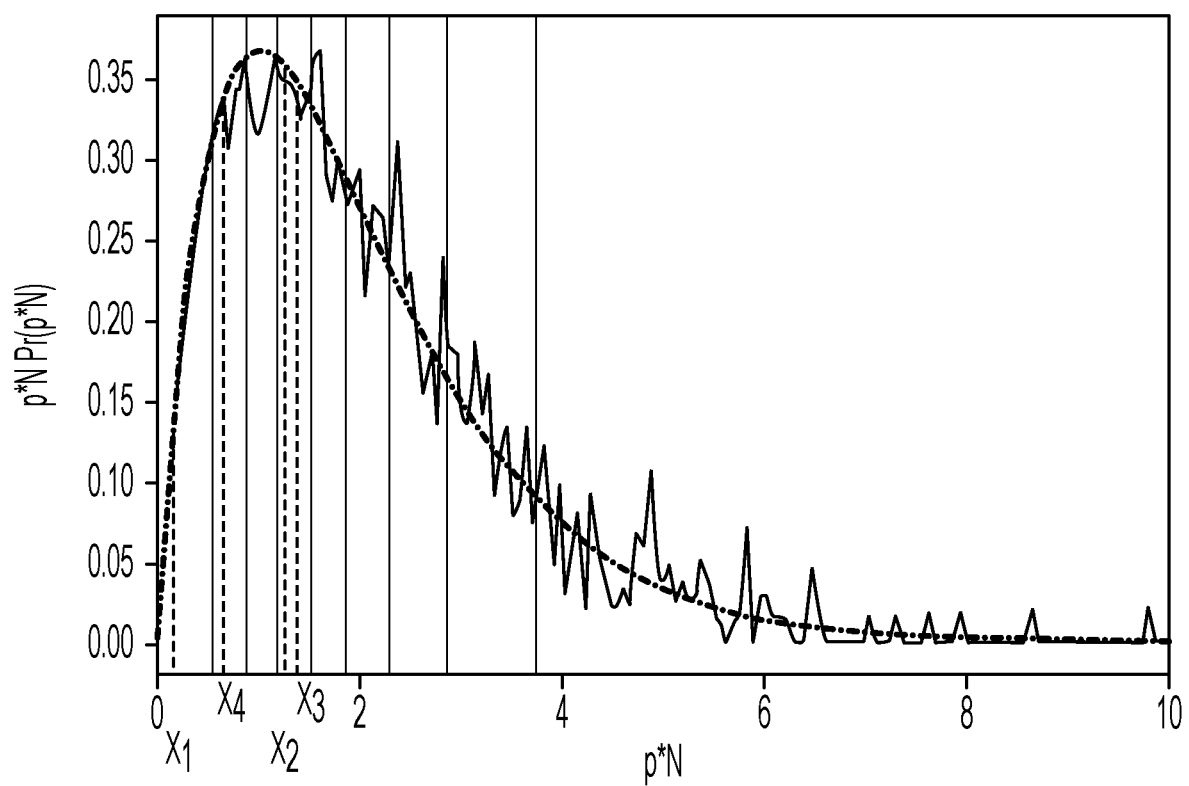
FIG. 5 is an example plot illustrating binning of four bitstrings according to experimental probabilities.

FIG. 5 is an example plot illustrating binning of four bitstrings according to experimental probabilities. The plurality of experimental outcomes are binned based on probabilities of the experimental outcomes to obtain the second distribution. Binning by experimental probability provides an indication of how far the second distribution is from the ideal distribution. Coherent noise can be modelled as small additional SU(2) gates in the random quantum circuit. The random quantum circuit still drives the output probability distribution towards a Porter-Thomas, but "permutes" bitstrings within the Porter-Thomas distribution. For example, in Table 2, bitstring $x_2$: |000001⟩ is assigned to bin 4 based on the experimental probability, instead of bin 3 in Table 1. Coherent noise may change the probabilities associated with a particular outcome, but does not change the shape of the overall distribution. Thus, binning by experimental probability is not sensitive to coherent noise.

Figure 6:
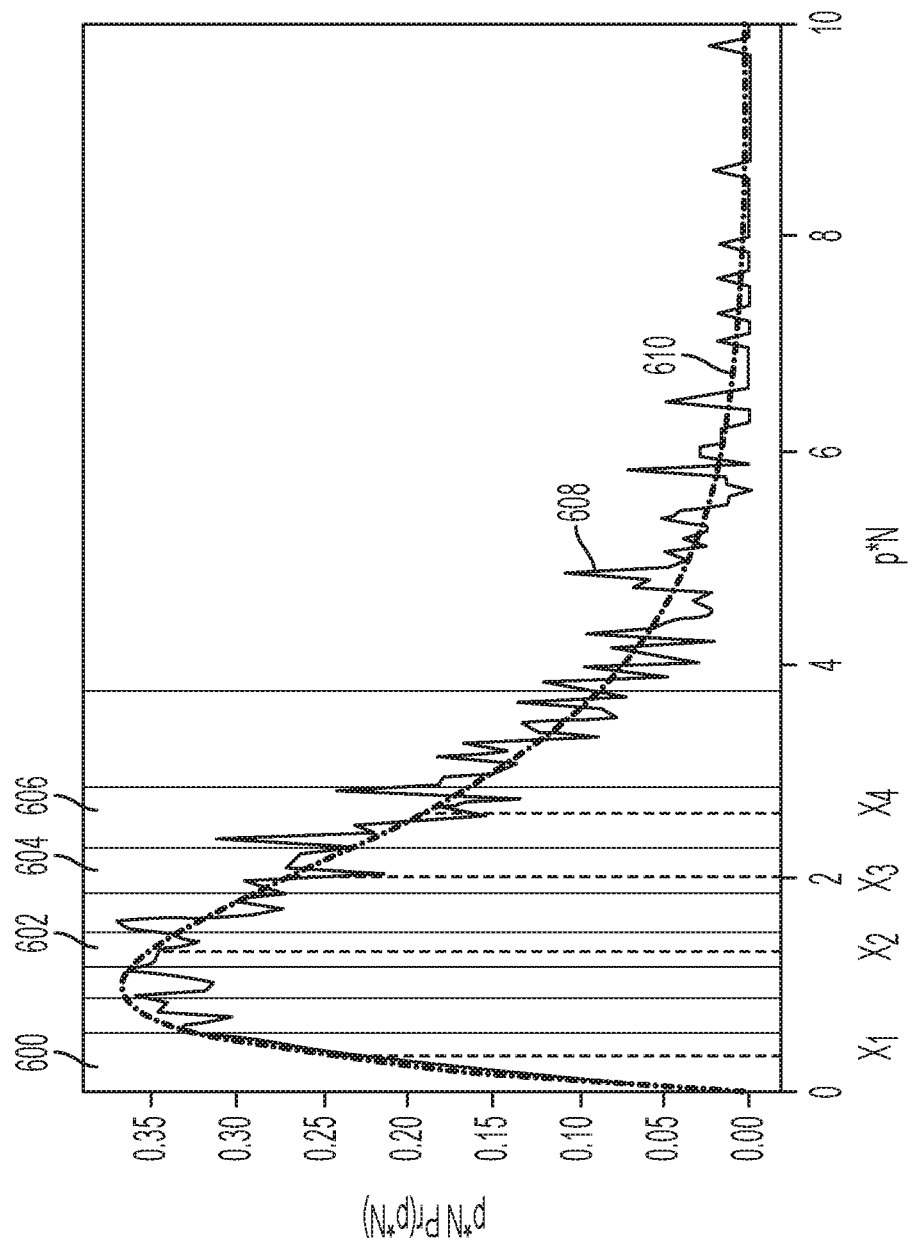
FIG. 6 is an example plot illustrating an ideal distribution.

FIG. 6 is an illustration of an example ideal distribution. Bitstrings $x_1$, $x_2$, $x_3$, and $x_4$ output from a noiseless simulation are sorted into bin 1 600, bin 4 602, bin 6 604, and bin 7 606, respectively, by their ideal probability. Bin edges are indicated by the solid vertical lines. Summing over all bitstrings and averaging over several circuits (jagged curve 608) reconstructs the ideal Porter-Thomas distribution (smooth curve 610).

Figure 7:
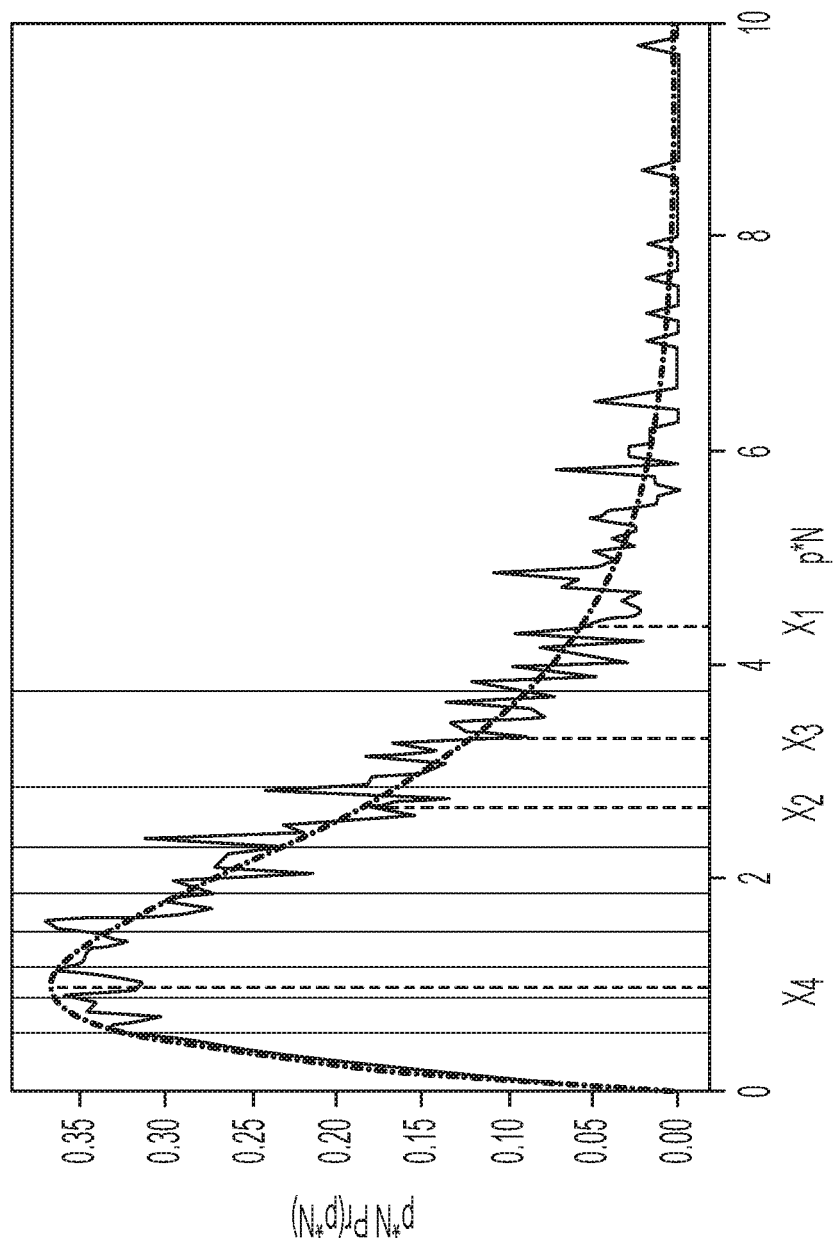
FIG. 7 is an example plot illustrating an example distribution from a simulation with coherent noise, binned by experimental probability.

FIG. 7 is an illustration of an example distribution from a simulation with coherent noise, binned by experimental probability. The experimental probabilities of bitstrings $x_1$-$x_4$ differs from the ideal (statevector computed) probabilities, and therefore the bitstrings are assigned to different bins. However, a Porter-Thomas distribution is still reconstructed when binning by the bitstrings' experimental probability.

Figure 8:
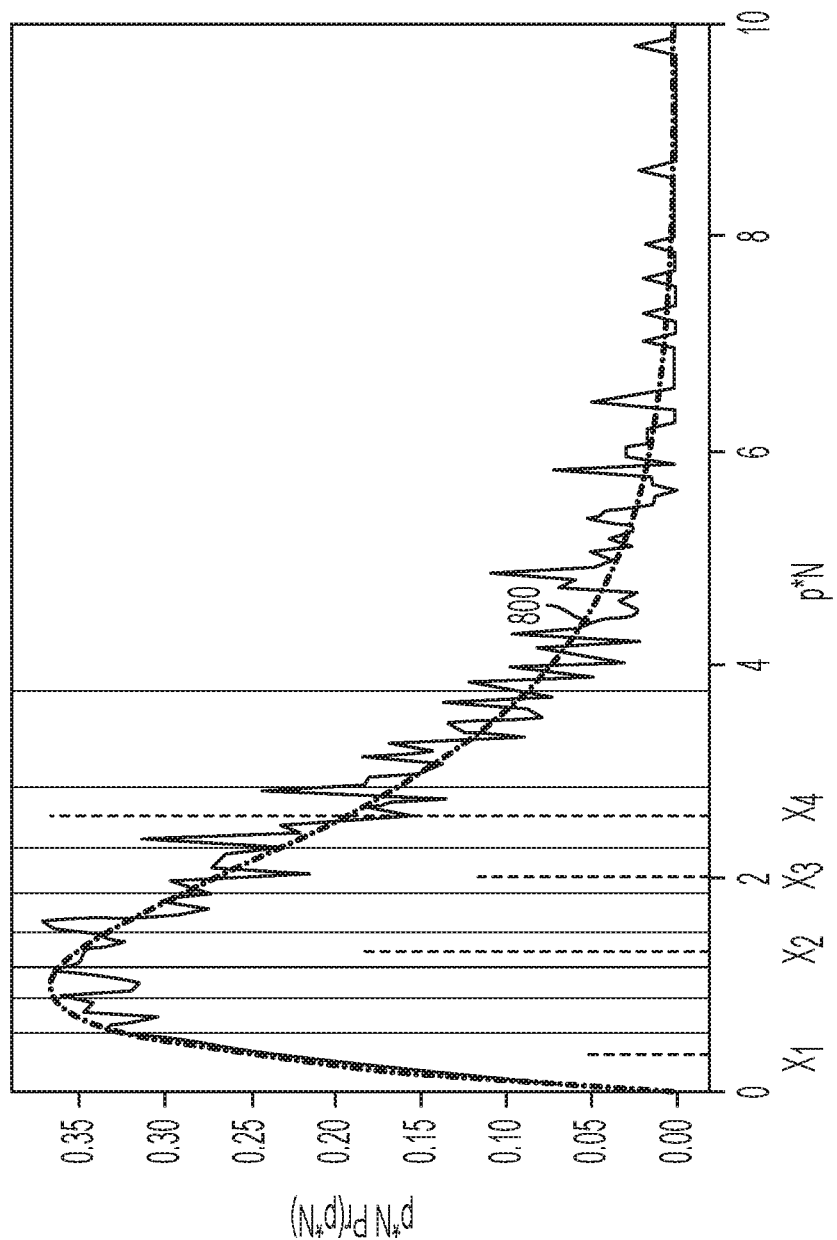
FIG. 8 is an example plot illustrating an example distribution from a simulation with coherent noise, binned by ideal probability.

FIG. 8 is an illustration of an example distribution from a simulation with coherent noise, binned by ideal probability. When summing the probabilities of bitstrings now, binned by ideal probability, a Porter-Thomas distribution is no longer constructed. The sum of the probabilities is indicated by the dashed vertical lines in FIG. 8. Note that the heights of the dashed vertical lines for bitstrings $x_1$-$x_4$ as in FIG. 7. However, because the bitstrings have been assigned to different bins, the heights of the dashed vertical lines no longer correspond to the Porter-Thomas distribution 800. FIG. 8 illustrates how binning by ideal probability is more discriminating than binning by experimental probability. Binning by ideal probability utilizes knowledge of which bitstrings must go into which bins. Permuting bitstrings within a Porter-Thomas distribution will now score poorly. Thus, binning by ideal probability is sensitive to coherent noise, whereas binning by experimental probability is not.

Both methods of binning are sensitive to incoherent noise. Incoherent noise will drive the output distribution towards a uniform distribution. In a uniform distribution, each outcome is equally likely. If the incoherent noise outcomes are binned according to their probability, i.e, the probabilities of the incoherent noise outcomes, the result is the distribution illustrated in FIG. 9. In the limit of an infinite number of outcomes, or "shots," the uniform distribution would be a vertical line at p*N=1. However, with a finite number of shots, the shot noise gives a natural spread to the vertical line, resulting in a Gaussian.

As described above, bins are generated based on the ideal distribution. Herein, the term "grouping" may refer to binning or assigning to bins. According to an embodiment of the present invention, a total number of the plurality of bins is polynomial in the plurality of qubits. The plurality of times that the random quantum circuit is run is greater than a total number of the plurality of bins. According to an embodiment of the present invention, the plurality of qubits is between 3 qubits and 100 qubits. The random quantum circuit according to an embodiment of the present invention may have a depth on the order of the plurality of qubits in the quantum system. The depth of the random quantum circuit is defined as the number of time steps required to run the random quantum circuit. As shown in FIG. 2, the circuit may perform operations on a plurality of qubits during a single time step.

According to an embodiment of the present invention, characterizing the noise includes calculating a first distance from the first distribution to an ideal distribution, the ideal distribution being based on the simulation; calculating a second distance from a first incoherent noise distribution to the ideal distribution, the first incoherent noise distribution having an equal probability for all possible incoherent noise outcomes, wherein the incoherent noise outcomes are grouped based on probabilities of the ideal outcomes; and calculating a first average circuit success ratio based on the first distance and the second distance. For example, an average success ratio may be defined as $$F = 1 - \frac{\delta(E, I)}{\delta(U, I)} \quad (1)$$

where E is the experimentally obtained distribution (binned either by ideal probability or by experimental probability), I is the ideal distribution obtained from the simulation on the classical computer, U is the uniform distribution corresponding to incoherent noise (binned either by ideal probability or by incoherent noise probability), and δ(A, B) is the variational distance between distributions.

Thus, the method according to an embodiment of the present invention includes calculating $\delta(E_{ideal\ prob}, I)$, which is a first distance from the first distribution to an ideal distribution. The method includes calculating $\delta(U_{ideal\ prob}, I)$, which is a second distance from a first incoherent noise distribution to the ideal distribution. The first incoherent noise distribution has an equal probability for all possible incoherent noise outcomes. However, the incoherent noise outcomes are binned based on probabilities of the ideal outcomes, for example, the ideal probabilities shown in Table 1. The method includes calculating a first average circuit success ratio based on the first distance and the second distance, for example, using Eqn. 1.

Figure 9:
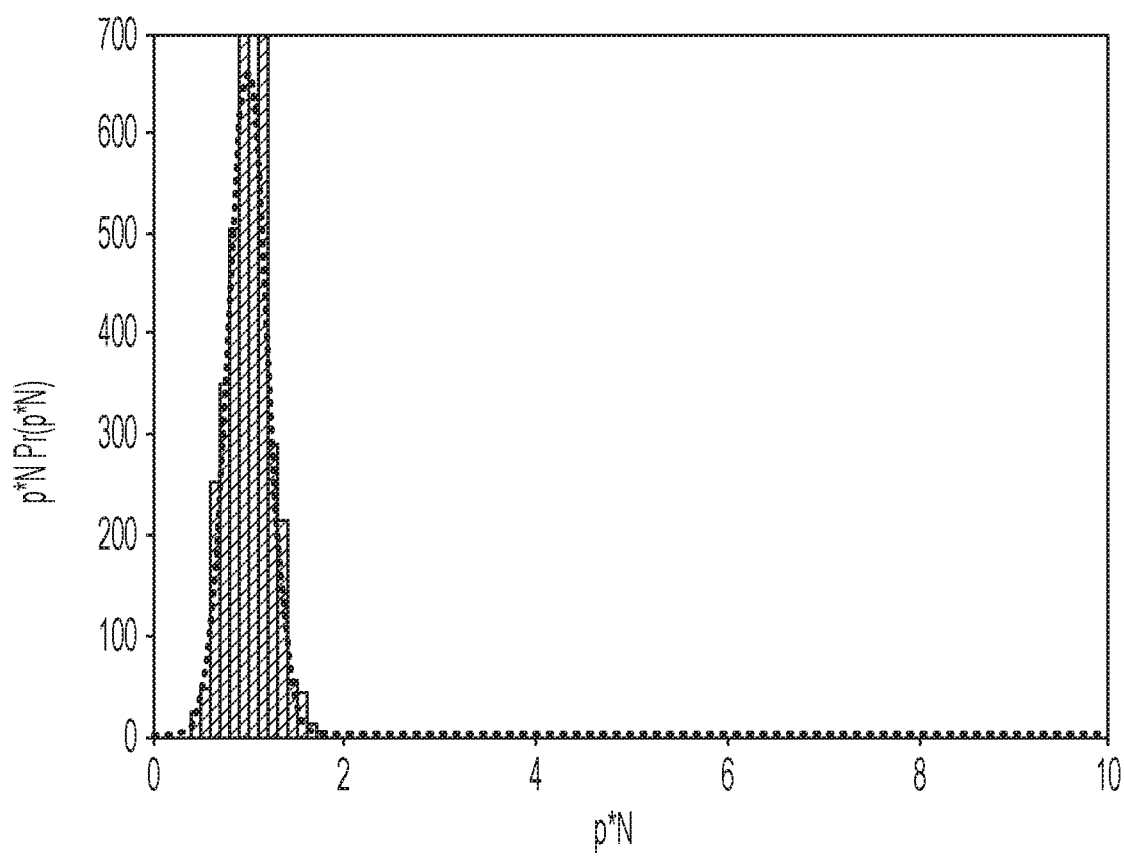
FIG. 9 is an example plot illustrating an example incoherent noise distribution, where the incoherent noise outcomes are binned according to their probability.

According to an embodiment of the present invention, characterizing the noise further includes calculating $\delta(E_{experimental\ prob}, I)$, which is a third distance from the second distribution to the ideal distribution. The method includes calculating $\delta(U_{incoherent\ noise\ prob}, I)$, which is a fourth distance from a second incoherent noise distribution to the ideal distribution. The second incoherent noise distribution has an equal probability for all possible incoherent noise outcomes, and the incoherent noise outcomes are grouped based on probabilities of the incoherent noise outcomes. An example of the second incoherent noise distribution is shown in FIG. 9. The method includes calculating a second average circuit success ratio based on the third distance and the fourth distance, for example, using Eqn. 1. The method includes calculating a measure of coherent noise in the quantum system based on a difference between the first average circuit success ratio and the second average circuit success ratio.

Figure 10:
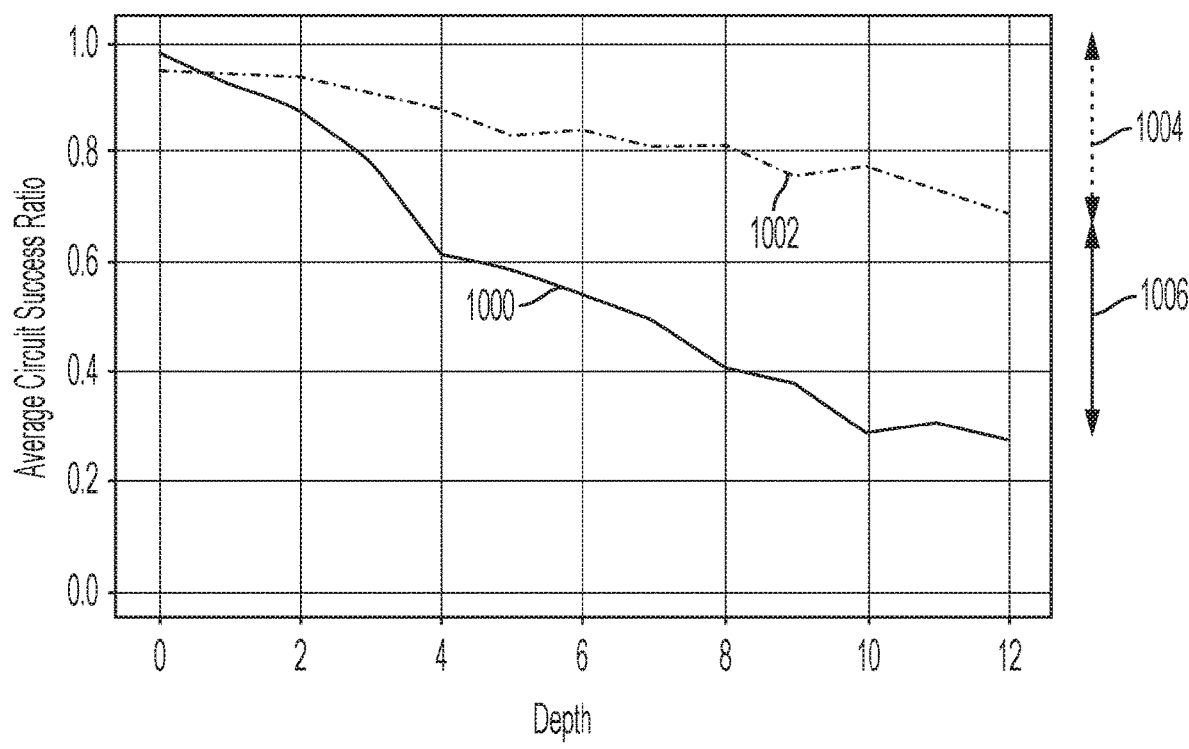
FIG. 10 is an example plot illustrating the first average circuit success ratio and the second average circuit success ratio as a function of depth.

FIG. 10 is an example plot of the first average circuit success ratio 1000 and the second average circuit success ratio 1002 as a function of depth. The plot is constructed from experimental data from a six qubit ring, like the ones shown in FIG. 2. The first average circuit ratio 1000 corresponds to binned output generation based on ideal probabilities, and the second average circuit success ratio 1002 corresponds to binned output generation based on experimental probabilities. A value of 1 on the y axis indicates no noise, i.e., the ideal distribution. The distance 1004 between 1 and the second average circuit success ratio 1002 is a measure of the incoherent noise in the quantum system. The distance 1006 between the second average circuit success ratio 1002 and the first average circuit success ratio 1000 is a measure of the coherent noise in the quantum system. The second average circuit success ratio 1002 is sensitive to incoherent noise, but not coherent noise. The first average circuit success ratio 100 is sensitive to coherent noise in addition to incoherent noise. Thus a difference in the average circuit success ratios is observed in a quantum system when the outcomes are binned by experimental probability vs. ideal probability.

Figure 11:
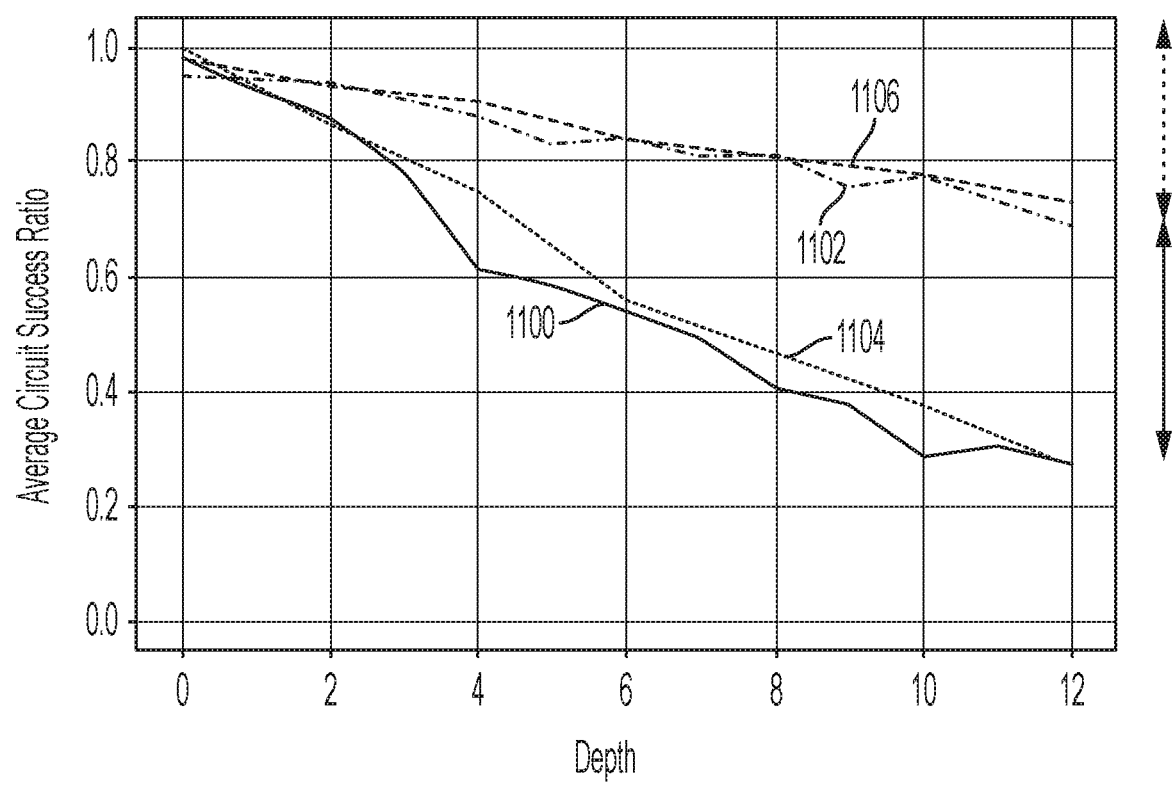
FIG. 11 shows the experimentally-obtained first average circuit success ratio and the second average circuit success ratio, as well as a first average circuit success ratio and second average circuit success ratio obtained by simulation.

FIG. 11 shows the experimentally-obtained first average circuit success ratio 1100 and the second average circuit success ratio 1102, as well as a first average circuit success ratio 1104 and second average circuit success ratio 1106 obtained by simulation. The first average circuit success ratio 1104 was obtained by simulating a device with T1 and T2 times corresponding to those of the quantum system. The first average circuit success ratio 1104 agrees well with the experimentally-obtained first average circuit success ratio 1100. The second average circuit success ratio 1106 was obtained by simulating 1% coherent noise in addition to the T1 and T2 times. The second average circuit success ratio 1106 agrees with the second average circuit success ratio 1102. FIG. 11 demonstrates how the method and systems described herein can be used to characterize noise in a quantum system according to an embodiment of the present invention.

According to an embodiment of the present invention, a method for characterizing noise in a quantum system includes applying successive layers of randomized single- and two-qubit unitaries and sampling the resulting distribution. For sufficiently deep circuits, the distribution will tend to a Porter-Thomas distribution in the absence of any noise. However, the presence of coherent noise does not drive the noisy output distribution away from Porter-Thomas. Instead, it scrambles the labels. Incoherent noise will drive the output distribution towards a uniform distribution. Thus, by binning the output results according to the expected ideal probabilities (obtained from simulating the circuit) versus binning the output results according to the experimentally obtained probabilities one can obtain a quantitative separation between coherent and incoherent noise. This method can scale with reasonable ease to more than 10-20 qubits, in contrast with the poor scalability of previous methods based on randomized benchmarking.

Figure 12:
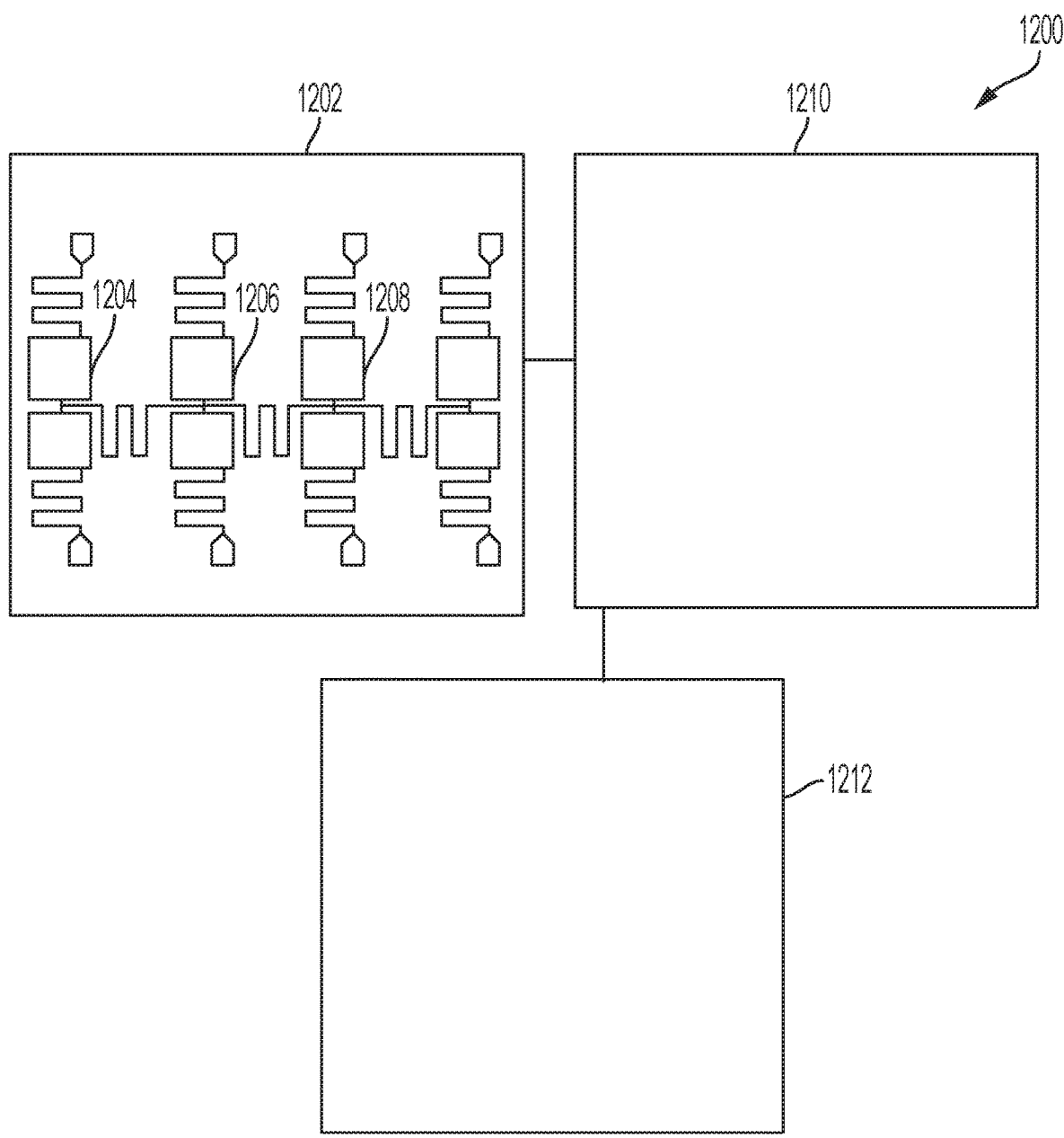
FIG. 12 is a schematic illustration of a system for characterizing noise in a quantum system according to an embodiment of the present invention.

FIG. 12 is a schematic illustration of a system 1200 for characterizing noise in a quantum system according to an embodiment of the present invention. The system 1200 includes a quantum processor 1202 including a plurality of qubits 1204, 1206, 1208, and a random quantum circuit 1210 including a plurality of entangling gates native to the quantum system. The system 1200 includes a classical processor 1212 configured to run a simulation of the random quantum circuit 1210 a plurality of times to obtain a corresponding plurality of ideal outcomes. The classical processor 1212 is further configured to receive from the quantum circuit 1210 a plurality of experimental outcomes corresponding to the quantum circuit 1210 acting on the plurality of qubits 1204, 1206, 1208 a plurality of times. The classical processor 1212 is further configured to group the plurality of experimental outcomes based on probabilities of the ideal outcomes to obtain a first distribution, and group the plurality of experimental outcomes based on probabilities of the experimental outcomes to obtain a second distribution. The classical processor 1212 is further configured to characterize noise in the quantum system based on the first distribution and the second distribution.

According to an embodiment of the present invention, the classical processor 1212 is configured to characterize noise in the quantum system by quantifying coherent and incoherent noise in the quantum system. According to an embodiment of the present invention, the classical processor 1212 is configured to group the plurality of experimental outcomes by defining a plurality of bins such that when the plurality of ideal outcomes are binned by ideal probability, a sum of probabilities in each bin is equal for a Porter-Thomas distribution. The total number of the plurality of bins may be polynomial in the number of qubits of the quantum processor. The plurality of times that the random quantum circuit 1210 is run may be greater than a total number of the plurality of bins.

The quantum processor 1202 includes between 3 qubits and 100 qubits. The qubits 1204, 1206, 1208 schematically illustrated in FIG. 12 are merely an example. The embodiments of the invention are not limited to the number of qubits shown in FIGS. 2 and 12, nor to a particular layout of qubits.

According to an embodiment of the present invention, the random quantum circuit 1210 includes a plurality of random single-qubit rotations. According to an embodiment of the present invention, the plurality of entangling gates native to the quantum system are two-qubit CNOT gates. According to an embodiment of the present invention, the random quantum circuit 1210 includes alternating cycles of single-qubit rotations and two-qubit CNOT gates. The random quantum circuit 1210 may have a depth on the order of the number of qubits in the quantum system.

According to an embodiment of the present invention, the classical processor 1212 is configured to characterize the noise by calculating a first distance from the first distribution to an ideal distribution, the ideal distribution being based on the simulation; calculating a second distance from a first incoherent noise distribution to the ideal distribution, the first incoherent noise distribution having an equal probability for all possible incoherent noise outcomes, wherein the incoherent noise outcomes are grouped based on probabilities of the ideal outcomes; and calculating a first average circuit success ratio based on the first distance and the second distance. This process according to an embodiment of the present invention is described above with respect to FIGS. 10 and 11.

According to an embodiment of the present invention, the classical processor 1212 is configured to characterize the noise by calculating a third distance from the second distribution to the ideal distribution; calculating a fourth distance from a second incoherent noise distribution to the ideal distribution, the second incoherent noise distribution having an equal probability for all possible incoherent noise outcomes, wherein the incoherent noise outcomes are grouped based on probabilities of the incoherent noise outcomes; calculating a second average circuit success ratio based on the third distance and the fourth distance; and calculating a measure of coherent noise in the quantum system based on a difference between the first average circuit success ratio and the second average circuit success ratio. This process according to an embodiment of the present invention is also described above with respect to FIGS. 10 and 11.

The classical processor 1212 can be a dedicated "hard-wired" device, or it can be a programmable device. For example, it can be, but is not limited to, a personal computer, a work station, or any other suitable electronic device for the particular application. In some embodiments, it can be integrated into a unit or it can be attachable, remote, and/or distributed.

According to an embodiment of the present invention, a computer-readable medium includes computer-executable code which when read by a computer causes the computer to run a simulation of a random quantum circuit a plurality of times to obtain a corresponding plurality of ideal outcomes, and receive from the quantum circuit a plurality of experimental outcomes corresponding to the quantum circuit acting on the plurality of qubits a plurality of times. The computer-executable code when read by a computer further causes the computer to group the plurality of experimental outcomes based on probabilities of the ideal outcomes to obtain a first distribution, group the plurality of experimental outcomes based on probabilities of the experimental outcomes to obtain a second distribution, and characterize noise in the quantum system based on the first distribution and the second distribution.

According to an embodiment of the invention, the computer-executable code when read by a computer further causes the computer to generate data to construct the random quantum circuit in a quantum processor.

The method disclosed herein measures and distinguishes incoherent noise from coherent noise in quantum systems with more than three qubits using the binned output of a random quantum circuit. Methods like multi-qubit randomized benchmarking (RB) require applying many native gates for a single multi-qubit Clifford gate, to the point where decoherence overwhelms the system before the requisite number of Cliffords can be applied. The method disclosed herein may require a circuit depth only on the order of the number of qubits in the system.

According to an embodiment of the present invention, a random circuit, including alternating cycles of single qubit SU(2) rotations and two qubit CNOT gates, is run which drives the probability distribution of the resulting output state towards a "Porter-Thomas" distribution. The method relies on the fact that coherent noise will still drive the output distribution towards a Porter-Thomas distribution, while incoherent noise will drive the output distribution towards a uniform distribution. After the experiment is run, the shots are binned either by their ideal probabilities (computed from a classical simulation) or by their experimental probabilities. The number of bins used may be polynomial in the number of qubits, and the bin edges are defined such that the summed probabilities within each bin are equal across bins for a Porter-Thomas distribution.

For each method of binning (by ideal probability or experimental probability), the distance away from the ideal binning and incoherent binning is calculated and a fidelity is calculated. The difference in fidelities of the two binning methods gives a measure of the coherent noise in the system. Thus, the method can quantitatively classify noise in a quantum system into coherent and incoherent noise.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method for characterizing noise in a quantum system, wherein the quantum system comprises a quantum processor comprising a plurality of qubits and a plurality of entangling gates native to the quantum system, and the method comprising:

generating a random quantum circuit on the quantum processor, wherein the random quantum circuit comprises a group of entangling gates of the plurality of entangling gates;

running, via a classical processor, a simulation of the random quantum circuit a first plurality of times to obtain a corresponding plurality of ideal outcomes;

running, via the quantum processor, the random quantum circuit on a second plurality of times to obtain a corresponding plurality of experimental outcomes from the random quantum circuit acting on a group of qubits of the plurality of qubits associated with the group of entangling gates;

grouping the plurality of experimental outcomes based on probabilities of the ideal outcomes to obtain a first distribution;

grouping the plurality of experimental outcomes based on probabilities of the experimental outcomes to obtain a second distribution; and characterizing noise in the quantum system based on the first distribution and the second distribution.

2. The method of claim 1, wherein characterizing noise in the quantum system comprises quantifying coherent noise and incoherent noise in the quantum system.

3. The method of claim 1, wherein the grouping of the plurality of experimental outcomes based on the probabilities of the ideal outcomes comprises defining a plurality of bins such that when the plurality of ideal outcomes are binned by ideal probability, a sum of probabilities in each bin is equal for a Porter-Thomas distribution.

4. The method of claim 3, wherein a first total number of the plurality of bins is a polynomial function of a second total number of the group of qubits.

5. The method of claim 1, wherein the plurality of qubits is between 3 qubits and 100 qubits.

6. The method of claim 1, wherein the random quantum circuit comprises a plurality of random single-qubit rotations.

7. The method of claim 1, wherein the plurality of entangling gates native to the quantum system are two-qubit CNOT gates.

8. The method of claim 1, wherein the random quantum circuit comprises alternating cycles of single-qubit rotations and two-qubit CNOT gates.

9. The method of claim 1, wherein the random quantum circuit has a depth on an order of the plurality of qubits in the quantum system.

10. The method of claim 1, wherein characterizing the noise comprises:
calculating a first distance from the first distribution to an ideal distribution, wherein the ideal distribution being based on the simulation;
calculating a second distance from a first incoherent noise distribution to the ideal distribution, the first incoherent noise distribution having an equal probability for all possible incoherent noise outcomes, wherein the incoherent noise outcomes are grouped based on the probabilities of the ideal outcomes; and
calculating a first average circuit success ratio based on the first distance and the second distance.

11. The method of claim 10, wherein characterizing the noise further comprises:
calculating a third distance from the second distribution to the ideal distribution;
calculating a fourth distance from a second incoherent noise distribution to the ideal distribution, wherein the second incoherent noise distribution having the equal probability for all possible incoherent noise outcomes, and wherein the incoherent noise outcomes are grouped based on probabilities of the incoherent noise outcomes;
calculating a second average circuit success ratio based on the third distance and the fourth distance; and
calculating a measure of coherent noise in the quantum system based on a difference between the first average circuit success ratio and the second average circuit success ratio.

12. A system for characterizing noise in a quantum system, comprising:
a quantum processor comprising a plurality of qubits and a plurality of entangling gates native to said quantum system;
a random quantum circuit comprising a group of entangling gates of the plurality of entangling gates, wherein the quantum processor runs the random quantum circuit a first plurality of times to obtain a corresponding plurality of experimental outcomes from the random quantum circuit acting on a group of qubits of the plurality of qubits associated with the group of entangling gates; and
a classical processor configured to:
run a simulation of said random quantum circuit a second plurality of times to obtain a corresponding plurality of ideal outcomes;
receive from the quantum processor the plurality of experimental outcomes;
group the plurality of experimental outcomes based on probabilities of the ideal outcomes to obtain a first distribution;
group the plurality of experimental outcomes based on probabilities of the experimental outcomes to obtain a second distribution; and
characterize noise in the quantum system based on the first distribution and the second distribution.

13. The system of claim 12, wherein the classical processor is configured to characterize noise in the quantum system by quantifying coherent noise and incoherent noise in the quantum system.

14. The system of claim 12, wherein the classical processor is configured to group the plurality of experimental outcomes based on the probabilities of the ideal outcomes by defining a plurality of bins such that when the plurality of ideal outcomes are binned by ideal probability, a sum of probabilities in each bin is equal for a Porter-Thomas distribution.

15. The system of claim 14, wherein a first total number of the plurality of bins is a polynomial function of a second total number of the group of qubits.

16. The system of claim 14, wherein the first plurality of times that the random quantum circuit is run is greater than a total number of the plurality of bins.

17. The system of claim 12, wherein the plurality of qubits is between 3 qubits and 100 qubits.

18. The system of claim 12, wherein the random quantum circuit comprises a plurality of random single-qubit rotations.

19. The system of claim 12, wherein the plurality of entangling gates native to the quantum system are two-qubit CNOT gates.

20. The system of claim 12, wherein the random quantum circuit comprises alternating cycles of single-qubit rotations and two-qubit CNOT gates.

21. The system of claim 12, wherein the random quantum circuit has a depth on an order of the plurality of qubits in the quantum system.

22. The system of claim 12, wherein the classical processor is configured to characterize the noise by:
calculating a first distance from the first distribution to an ideal distribution, wherein the ideal distribution being based on the simulation;
calculating a second distance from a first incoherent noise distribution to the ideal distribution, wherein the first incoherent noise distribution having an equal probability for all possible incoherent noise outcomes, and wherein the incoherent noise outcomes are grouped based on the probabilities of the ideal outcomes; and calculating a first average circuit success ratio based on the first distance and the second distance.

23. The system of claim 22, wherein the classical processor is further configured to characterize the noise by:

calculating a third distance from the second distribution to the ideal distribution;

calculating a fourth distance from a second incoherent noise distribution to the ideal distribution, wherein the second incoherent noise distribution having the equal probability for all possible incoherent noise outcomes, and wherein the incoherent noise outcomes are grouped based on probabilities of said incoherent noise outcomes;

calculating a second average circuit success ratio based on the third distance and the fourth distance; and calculating a measure of coherent noise in the quantum system based on a difference between the first average circuit success ratio and the second average circuit success ratio.

24. A non-transitory computer-readable medium comprising computer-executable code which when read by a quantum system causes the quantum system to:

run, via a classical processor of the quantum system, a simulation of a random quantum circuit of a quantum processor of the quantum system a first plurality of times to obtain a corresponding plurality of ideal outcomes, wherein the random quantum circuit comprises a group of entangling gates of a plurality of entangling gates of the quantum processor associated with a group of qubits of a plurality of qubits of the quantum processor;

receive from the quantum processor circuit a plurality of experimental outcomes corresponding to the random quantum circuit acting on the group of qubits a second plurality of times;

group the plurality of experimental outcomes based on probabilities of the ideal outcomes to obtain a first distribution;

group the plurality of experimental outcomes based on probabilities of the experimental outcomes to obtain a second distribution; and characterize noise in the quantum system based on the first distribution and the second distribution.

25. The non-transitory computer-readable medium of claim 24, wherein the computer-executable code when read by the quantum system further causes the quantum system to:

generate data to construct the random quantum circuit in the quantum processor.

* * * * *